United States Patent
Takahashi

(10) Patent No.: US 7,973,382 B2
(45) Date of Patent: Jul. 5, 2011

(54) SEMICONDUCTOR DEVICE

(75) Inventor: Tetsuo Takahashi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 232 days.

(21) Appl. No.: 11/782,390

(22) Filed: Jul. 24, 2007

(65) Prior Publication Data

US 2008/0203496 A1    Aug. 28, 2008

(30) Foreign Application Priority Data

Feb. 28, 2007   (JP) ................................. 2007-049445

(51) Int. Cl.
*H01L 23/58* (2006.01)

(52) U.S. Cl. ........ 257/487; 257/488; 257/491; 257/492; 257/493; 257/339

(58) Field of Classification Search .................. 257/488, 257/491, 492, 493, 409, 367; 438/140, 454
See application file for complete search history.

(56) References Cited

U.S. PATENT DOCUMENTS

| | | | | |
|---|---|---|---|---|
| 5,455,439 A | * | 10/1995 | Terashima et al. | 257/401 |
| 6,150,702 A | * | 11/2000 | Funaki et al. | 257/409 |
| 6,307,232 B1 | * | 10/2001 | Akiyama et al. | 257/347 |
| 6,507,085 B2 | * | 1/2003 | Shimizu | 257/502 |
| 6,844,613 B2 | | 1/2005 | Shimizu | |
| 6,879,005 B2 | * | 4/2005 | Yamaguchi et al. | 257/367 |
| 2005/0194656 A1 | * | 9/2005 | Shimizu | 257/488 |

FOREIGN PATENT DOCUMENTS

| | | |
|---|---|---|
| JP | 2-68961 | 3/1990 |
| JP | 3-49265 | 3/1991 |
| JP | 3-235367 | 10/1991 |
| JP | 6-77470 | 3/1994 |
| JP | 2004-179496 | 6/2004 |
| JP | 2005-251903 | 9/2005 |

OTHER PUBLICATIONS

K. Shimizu, et al., "A 600V HVIC Process with a built-in EPROM which enables new concept Gate Driving", ISPSD '04 (Proceedings of the 16th International Symposium on Power Semiconductor Devices & ICs), May 24-27, 2004, 5 pages.
U.S. Appl. No. 12/685,180, filed Jan. 11, 2010, Takahashi, et al.

* cited by examiner

*Primary Examiner* — Steven Loke
*Assistant Examiner* — David Goodwin
(74) *Attorney, Agent, or Firm* — Oblon, Spivak, McClelland, Maier & Neustadt, L.L.P.

(57) ABSTRACT

A gate electrode 20 and first field plates 22a to 22d and 23 are provided on a field oxide film 19. The gate electrode 20 and first field plates 22a to 22d and 23 are covered with an insulating film 24. A high-voltage wiring conductor 28 is provided on the insulating film 24. A shielding electrode 29 is provided between the first field plate 22a positioned closest to a source side and the high-voltage wiring conductor 28.

6 Claims, 7 Drawing Sheets

SEMICONDUCTOR DEVICE

BACKGROUND OF THE INVENTION

1. Field of the Invention

The present invention relates to a high-withstand-voltage semiconductor device using a multiple floating field-plate (MFFP) and, more particularly, to a semiconductor device which can be designed to have an increased withstand voltage.

2. Background Art

High-voltage ICs (HVIC) are being used for gate control on power semiconductors, e.g., an IGBT mounted in an inverter. Some HVICs have low-side and high-side gate drive circuits and a logic circuit for control incorporated in one chip. Also, an HVIC incorporating a high-withstand-voltage level shifter (semiconductor device) using a multiple floating field-plate (MFFP) for driving a high-side IGBT gate has been proposed (see, for example, Japanese Patent Laid-Open No.2005-251903 or pp-379 to 382 of ISPSD 2004).

FIG. 11 is a plan view showing a conventional semiconductor device. FIG. 12 is a sectional view taken along line F-F' in FIG. 11.

An n-type semiconductor layer 12 is epitaxially grown on a p-type semiconductor substrate 11. An $n^+$-type drain region 13 is provided in an upper surface of the semiconductor layer 12 substantially at a center of a region in which a MOS transistor 102 is disposed. An $n^-$-type buried layer 14 and an $n^+$-type buried layer 15 are provided at the interface between the semiconductor layer 12 and the semiconductor substrate 11 below the drain region 13. A back electrode 16 is connected to a lower surface of the semiconductor substrate 11. The back electrode 16 is grounded.

A p-type impurity region 17 is formed in the upper surface of the semiconductor layer 12 separately from the drain region 13 so as to surround the drain region 13. An $n^+$-type source region 18 is provided in the upper surface of the impurity region 17 so as to surround the drain region 13.

A field oxide film 19 is provided on the semiconductor layer 12 between the impurity region 17 and the drain region 13. A gate electrode 20 and first field plates 22a to 22d and 23 are provided on the field oxide film 19. The gate electrode 20 and the first field plates 22a to 22d and 23 are orderly placed along a direction from the source region 18 toward the drain region 13 by being spaced apart one from another. The gate electrode 20 and the first field plates 22a to 22d and 23 surround the drain region 13 so that the drain region 13 is centered in the configuration of the gate electrode and the field plates as viewed in plan. The first field plates 22a to 22d and 23 are floating electrodes insulated from portions existing on the peripheries thereof.

The gate electrode 20 also extends from the field oxide film 19 to the impurity region 17 and covers an end portion of the impurity region 17 interposed between the source region 18 and the semiconductor layer 12, with a gate oxide film 21 interposed between the gate electrode 20 and the end portion of the impurity region 17. The first field plate 23 extends from the field oxide film 19 to the drain region 13 and covers an end portion of the drain region 13 without contacting the same.

Above the semiconductor layer 12 and the field oxide film 19, an insulating film 24 covers the gate electrode 20 and the first field plates 22a to 22d and 23. A source electrode 25 is electrically connected to the impurity region 17 and the source region 18 by being extended through the insulating film 24. A drain electrode 26 is electrically connected to the drain region 13 by being extended through the insulating film 24.

Second field plates 27a to 27e are provided on the insulating film 24. The second field plates 27a to 27e are floating electrodes insulated from portions existing on the peripheries thereof. The second field plates 27a to 27e are orderly placed respectively above gaps between the gate electrode 20 and the first field plates 22a to 22d and 23 along a direction from the source region 18 toward the drain region 13 by being spaced apart one from another. The second field plates 27a to 27e are placed so that each second field plate overlaps, as viewed in plan, end portions of the corresponding two first field plates adjacent to each other and located below the second field plate. The second field plates 27a to 27e have cut portions in a region through which a high-voltage wiring conductor 28 described below extends. The second field plates 27a to 27e surround the drain region 13 generally on the entire periphery of the same as viewed in plan except at the cut portions.

The high-voltage wiring conductor 28 is provided on the insulating film 24 to electrically connect an external high-potential logic circuit 101 and the drain electrode 26 to each other. The high-voltage wiring conductor 28 extends over the gate electrode 20 and the first field plates 22a to 22d and 23. The high-voltage wiring conductor 28 is spaced apart from the second field plates 27a to 27e.

The first field plate 23 is electrostatically coupled to the upper surface of the drain region 13. The gate electrode 20 functions as a field plate, and the gate electrode 20 and the first field plates 22a to 22d are electrostatically coupled to each other and also to the upper surface of the semiconductor layer 12. Electric field concentration on the upper surface of the semiconductor layer 12 based on the potential difference between the drain region 13 and the source region 18 can be reduced by the above-described electrostatic coupling.

In the above-described conventional semiconductor device, however, the potential on the first field plates 22a to 22d and 23 which need to have a lower potential is increased under the influence of the high-voltage wiring conductor 28, to which a high voltage of several hundred volts is applied. In particular, the influence on the first field plate 22a which is positioned closest to the source side and which needs to have the lowest potential is large. Electric field concentration therefore occurs in the vicinity of the upper surface of the semiconductor layer 12, so that the extension of a depletion layer is limited and the withstand voltage is reduced.

SUMMARY OF THE INVENTION

In view of the above-described problem, an object of the present invention is to provide a semiconductor device which can be designed to have an increased withstand voltage.

According to one aspect of the present invention, a semiconductor device has a semiconductor substrate of a first conduction type; a semiconductor layer of a second conduction type provided on the semiconductor substrate; a drain region of the second conduction type provided in an upper surface of the semiconductor layer and having an impurity concentration higher than that in the semiconductor layer; a drain electrode electrically connected to the drain region; an impurity region of the first conduction type provided in an upper surface of the semiconductor layer; a source region of the second conduction type provided in an upper surface of the impurity region; a first insulating film provided on the semiconductor layer between the impurity region and the drain region; a plurality of first field plates provided on the first insulating film along a direction from the source region toward the drain region while being spaced apart one from another; a gate electrode which covers an end portion of the impurity region interposed between the source region and the semiconductor layer, with a gate oxide film interposed between the gate electrode and the end portion of the impurity region; a second insulating film which covers the plurality of first field plates and the gate electrode; a plurality of second field plates provided on the second insulating film above gaps between the plurality of first field plates; a high-voltage wiring conductor provided on the second insulating film while being spaced apart from the plurality of second field plates, the high-voltage wiring conductor extending over the plurality of first field plates and electrically connected to the drain electrode; and a shielding electrode provided between the first field plate positioned closest to a source side and the high-voltage wiring conductor.

The present invention makes it possible to increase the withstand voltage.

Other and further objects, features and advantages of the invention will appear more fully from the following description.

DETAILED DESCRIPTION OF THE PREFERRED EMBODIMENTS

First Embodiment

Figure 1:
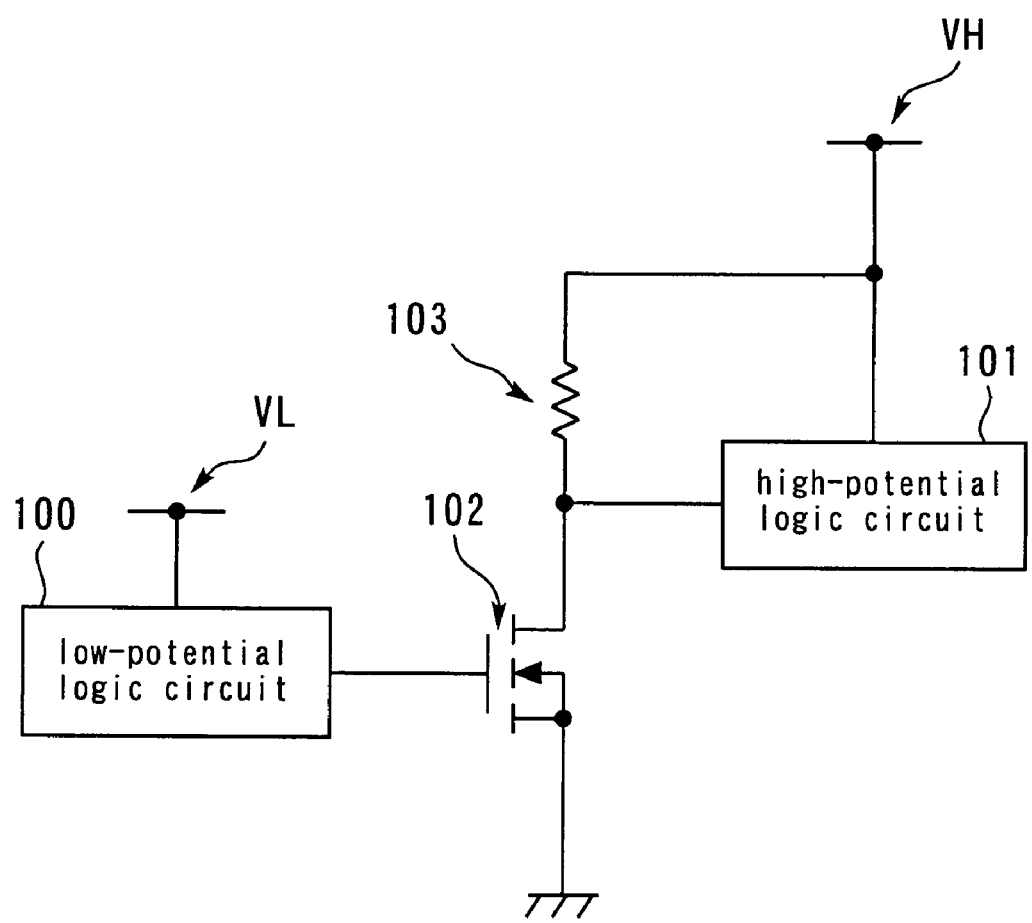
FIG. 1 is a block diagram showing an HVIC using a semiconductor device according to the first embodiment of the present invention.

FIG. 1 is a block diagram showing an HVIC using a semiconductor device according to the first embodiment of the present invention. The HVIC has a low-potential logic circuit 100, a high-potential logic circuit 101, an n-channel MOS transistor 102 which is a semiconductor according to the first embodiment of the present invention, and a resistor 103.

The low-potential logic circuit 100 is a logic circuit operating on a plus power supply which is a comparatively low potential VL of several ten volts. Ground potential is applied as a minus power supply to the low-potential logic circuit 100. The high-potential logic circuit 101 is a logic circuit operating on a plus power supply which is a comparatively high potential VH of several hundred volts. A potential of several hundred volts is also applied as a minus power supply to the high-potential logic circuit 101. The potential difference between the plus and minus power supplies for the high-potential logic circuit 101 is several ten volts.

The MOS transistor 102 and the resistor 103 level-shifts a low-potential signal output from the low-potential logic circuit 100 to a high potential and inputs the high-potential signal to the high-potential logic circuit 101. The gate of the MOS transistor 102 is connected to the low-potential logic circuit 100. Ground potential is connected the source of the MOS transistor 102. One end of the resistor 103 and the high-potential logic circuit 101 are connected to the drain of the MOS transistor 102. The potential VH is applied to the other end of the resistor 103.

In the HVIC having the above-described configuration, a high-level signal of the potential VH is input to the high-potential logic circuit 101 when the MOS transistor 102 is off. When a high-level signal is output from the low-potential logic circuit 100, the MOS transistor 102 is turned on and a current flows through the resistor 103. A voltage drop then occurs across the resistor 103 to reduce the drain potential on the MOS transistor 102, thereby changing the level of the signal input to the high-potential logic circuit 101. Thus, a pulse signal output from the low-potential logic circuit 100 is converted into a high-potential pulse signal of a polarity different from that of the signal output from the low-potential logic circuit 100, and the high-potential pulse signal is input to the high-potential logic circuit 101. Accordingly, the high-potential logic circuit 101 can operate on the basis of the signal output from the low-potential logic circuit 100.

Figure 2:
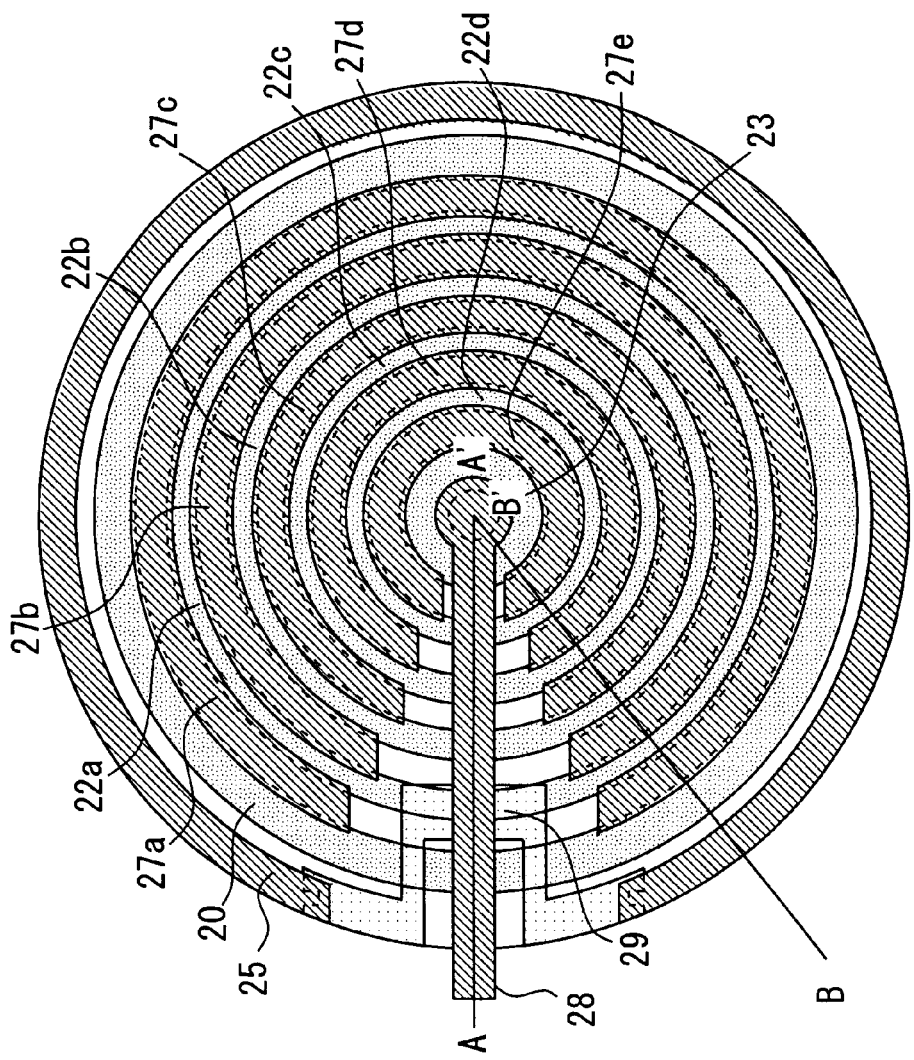
FIG. 2 is a plan view showing the semiconductor device according to the first embodiment of the present invention.
Figure 3:
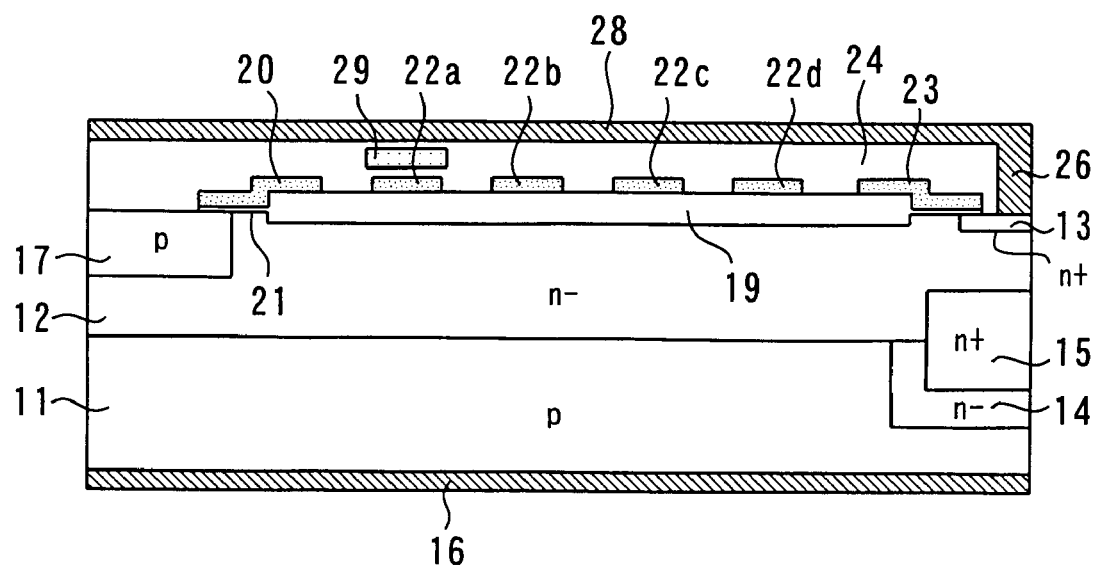
FIG. 3 is a sectional view taken along line A-A' in FIG. 2.
Figure 4:
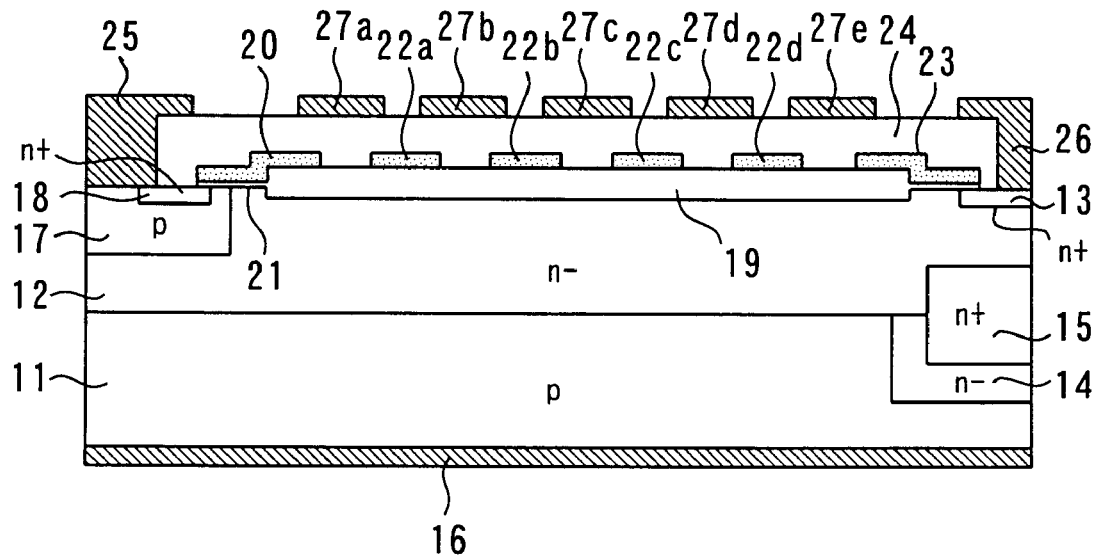
FIG. 4 is a sectional view taken along line B-B' in FIG. 2.

FIG. 2 is a plan view showing the semiconductor device according to the first embodiment of the present invention. FIG. 3 is a sectional view taken along line A-A' in FIG. 2. FIG. 4 is a sectional view taken along line B-B' in FIG. 2.

An n-type semiconductor layer 12 is epitaxially grown on a p-type semiconductor substrate 11. An $n^+$-type drain region 13 is provided in an upper surface of the semiconductor layer 12 substantially at a center of a region in which the MOS transistor 102 is disposed. An $n^-$-type buried layer 14 and an $n^+$-type buried layer 15 are provided at the interface between the semiconductor layer 12 and the semiconductor substrate 11 below the drain region 13. A back electrode 16 is connected to a lower surface of the semiconductor substrate 11. The back electrode 16 is grounded.

A p-type impurity region 17 is formed in the upper surface of the semiconductor layer 12 separately from the drain region 13 so as to surround the drain region 13. An $n^+$-type source region 18 is provided in the upper surface of the impurity region 17 so as to surround the drain region 13.

A field oxide film 19 (first insulating film) is provided on the semiconductor layer 12 between the impurity region 17 and the drain region 13. A gate electrode 20 and first field plates 22a to 22d and 23 are provided on the field oxide film 19. The gate electrode 20 and the first field plates 22a to 22d and 23 are orderly placed along a direction from the source region 18 toward the drain region 13 by being spaced apart one from another. The gate electrode 20 and the first field plates 22a to 22d and 23 surround the drain region 13 so that the drain region 13 is centered in the configuration of the gate electrode and the field plates as viewed in plan. The first field plates 22a to 22d and 23 are floating electrodes insulated from portions existing on the peripheries thereof.

The gate electrode 20 also extends from the field oxide film 19 to the impurity region 17 and covers an end portion of the impurity region 17 interposed between the source region 18 and the semiconductor layer 12, with a gate oxide film 21 interposed between the gate electrode 20 and the end portion of the impurity region 17. The first field plate 23 extends from the field oxide film 19 to the drain region 13 and covers an end portion of the drain region 13 without contacting the same.

Above the semiconductor layer 12 and the field oxide film 19, an insulating film 24 (second insulating film) covers the gate electrode 20 and the first field plates 22a to 22d and 23. A source electrode 25 is electrically connected to the impurity region 17 and the source region 18 by being extended through the insulating film 24. A drain electrode 26 is electrically connected to the drain region 13 by being extended through the insulating film 24.

Second field plates 27a to 27e are provided on the insulating film 24. The second field plates 27a to 27e are floating electrodes insulated from portions existing on the peripheries thereof. The second field plates 27a to 27e are orderly placed respectively above gaps between the gate electrode 20 and the first field plates 22a to 22d and 23 along a direction from the source region 18 toward the drain region 13 by being spaced apart one from another. The second field plates 27a to 27e are placed so that each second field plate overlaps, as viewed in plan, end portions of the corresponding two first field plates adjacent to each other and located below the second field plate. The second field plates 27a to 27e have cut portions in a region through which a high-voltage wiring conductor 28 described below extends. The second field plates 27a to 27e surround the drain region 13 generally on the entire periphery of the same as viewed in plan except at the cut portions.

The high-voltage wiring conductor 28 is provided on the insulating film 24 to electrically connect an external high-potential logic circuit 101 and the drain electrode 26 to each other. The high-voltage wiring conductor 28 extends over the gate electrode 20 and the first field plates 22a to 22d and 23. The high-voltage wiring conductor 28 is spaced apart from the second field plates 27a to 27e.

At a position at which the first field plate 22a positioned closest to the source side intersects the high-voltage wiring conductor 28, a shielding electrode 29 is provided between the first field plate 22a and the high-voltage wiring conductor 28. The shielding electrode 29 according to the first embodiment is larger in width than the first field plate 22a and entirely covers the first field plate 22a. The shielding electrode 29 is connected to the source electrode 25 by the side of the high-voltage wiring conductor 28 to be fixed on the source potential. However, the potential on the shielding electrode 29 is not limited to this. Setting the potential on the shielding electrode 29 lower than the potential on the first field plate 22a may suffice. Accordingly, the shielding electrode 29 may be grounded or connected to the gate electrode 20.

Each of the gate electrode 20, the first field plates 22a to 22d and the shielding electrode 29 is made of polysilicon for example, and each of the second field plates 27a to 27e and the high-voltage wiring conductor 28 is made of aluminum for example. Selection of the number of the first field plates and the number of second field plates depends on the withstand voltage. A wiring conductor (not shown) electrically connected to the gate electrode 20 is also provided on the insulating film 24. Through this wiring conductor, a signal from the low-potential logic circuit 100 is input to the gate electrode 20 of the MOS transistor 102.

In the semiconductor device according to the first embodiment having the above-described structure, a potential VH of several hundred volts is applied to the high-voltage wiring conductor 28, while ground potential is applied to the source electrode 25. When a high-level signal of several ten volts is applied to the gate electrode 20 from the low-potential logic circuit 100, the MOS transistor 102 is turned on to cause a current to flow from the drain electrode 26 to the source electrode 25 by flowing through the drain region 13, the semiconductor layer 12, the impurity region 17 and the source region 18 in this order.

A high potential is applied to the high-voltage wiring conductor 28, as described above. Under the application of this potential, the second field plates 27a to 27e and the gate electrode 20 and the first field plates 22a to 22d and 23 positioned below the second field plates 27a to 27e electrostatically couple to each other to reduce electric field concentration on the upper surface of the semiconductor layer 12 based on the potential on the high-voltage wiring conductor 28.

Since the potential VH is applied to the drain region 13, the first field plate 23 closest to the drain region 13 has a potential value close to the potential VH under the influence of the potential on the drain region 13. On the other hand, a low potential of several ten volts is applied to the gate electrode 20. Accordingly, the potentials on the gate electrode 20 and the first field plates 22a to 22d and 23 and the second field plates 27a to 27e change from a low potential of several ten volts to a high potential of several hundred volts according to electrostatic coupling therebetween with approach from the source region 18 to the drain region 13. The first field plate 22a is positioned closest to the source side (closest to the gate electrode 20) among the first field plates 22a to 22d and 23. The potential on the first field plate 22a is low and, therefore, a large potential difference occurs between the first field plate 22a and the high-voltage wiring conductor 28 to which a high potential of several hundred volts is applied.

In this embodiment, therefore, the shielding electrode 29 is placed between the first field plate 22a and the high-voltage wiring conductor 28. By the electrostatic shielding effect of the shielding electrode 29, the influence of the high-voltage wiring conductor 28 is reduced. Also, the high-voltage wiring conductor 28 is capacitively coupled to the low-potential shielding electrode 29 to reduce the potential on the first field plate 22a. Electric field concentration in the vicinity of the upper surface of the semiconductor layer 12 based on the potential on the high-voltage wiring conductor 28 is thereby reduced to improve the withstand voltage. The first field plate 22a receives the influence from the shielding electrode 29, but the influence from the shielding electrode 29 is small in comparison with the influence from the high-voltage wiring conductor 28 because the potential difference between the first field plate and the shielding electrode 29 is very small.

In this embodiment, the shielding electrode 29 is only provided below the high-voltage wiring conductor 28 and there is no need to modify the fundamental structural portion that determines the voltage withstanding structure. Therefore the pattern design efficiency is improved.

The shielding electrode 29 may be provided between the high-voltage wiring conductor 28 and the first field plates 22b to 22d on the higher-potential side as well as between the high-voltage wiring conductor 28 and the first field plate 22a.

Second Embodiment

Figure 5:
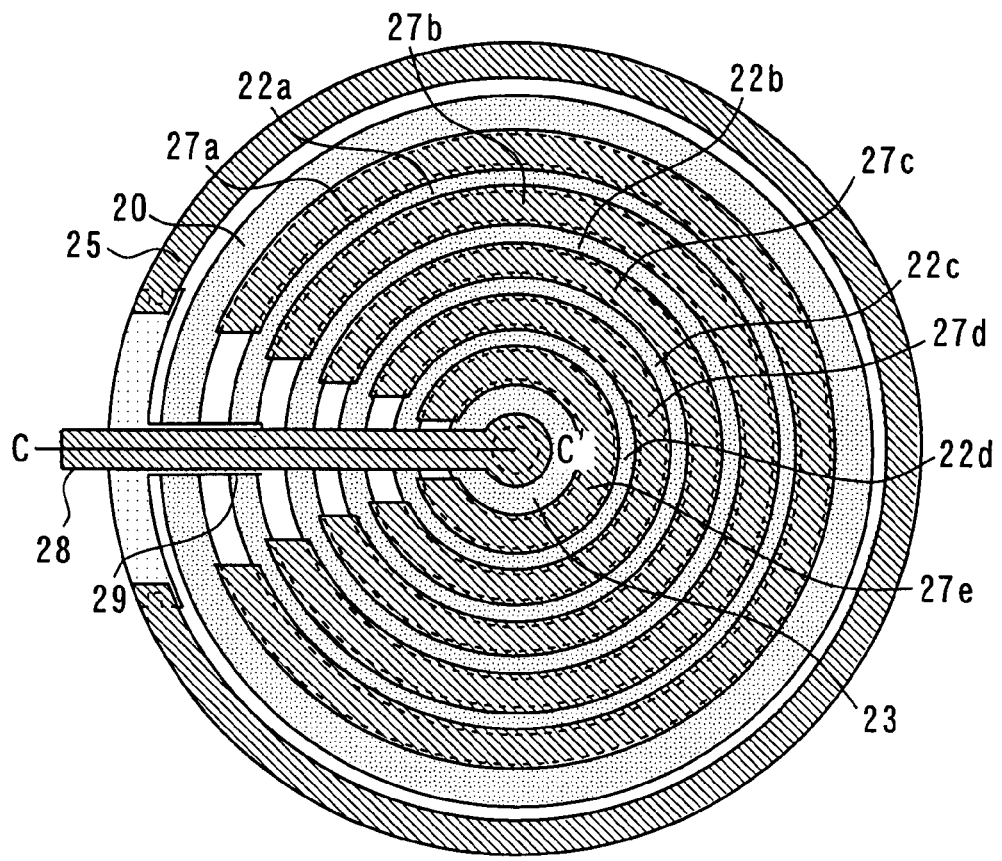
FIG. 5 is a plan view of a semiconductor device according to the second embodiment of the present invention.
Figure 6:
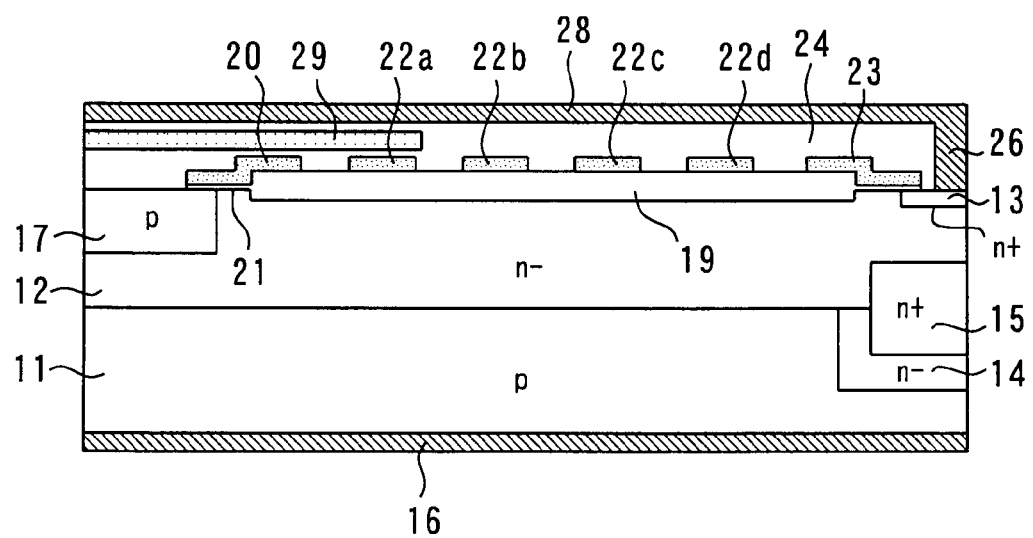
FIG. 6 is a sectional view taken along line C-C' in FIG. 5.

FIG. 5 is a plan view of a semiconductor device according to the second embodiment of the present invention. FIG. 6 is a sectional view taken along line C-C' in FIG. 5.

In the second embodiment, the shielding electrode 29 is laid along the high-voltage wiring conductor 28 on the lower-potential side of the first field plate 22a. That is, the shielding electrode 29 exists below the high-voltage wiring conductor 28 on the lower-potential side of the first field plate 22a. In other respects, the construction is the same as that of the first embodiment.

In this way, the effect of preventing inversion of the impurity region 17 due to the high-voltage wiring conductor 28 and preventing a malfunction is achieved as well as the same effect as that of the first embodiment.

Third Embodiment

Figure 7:
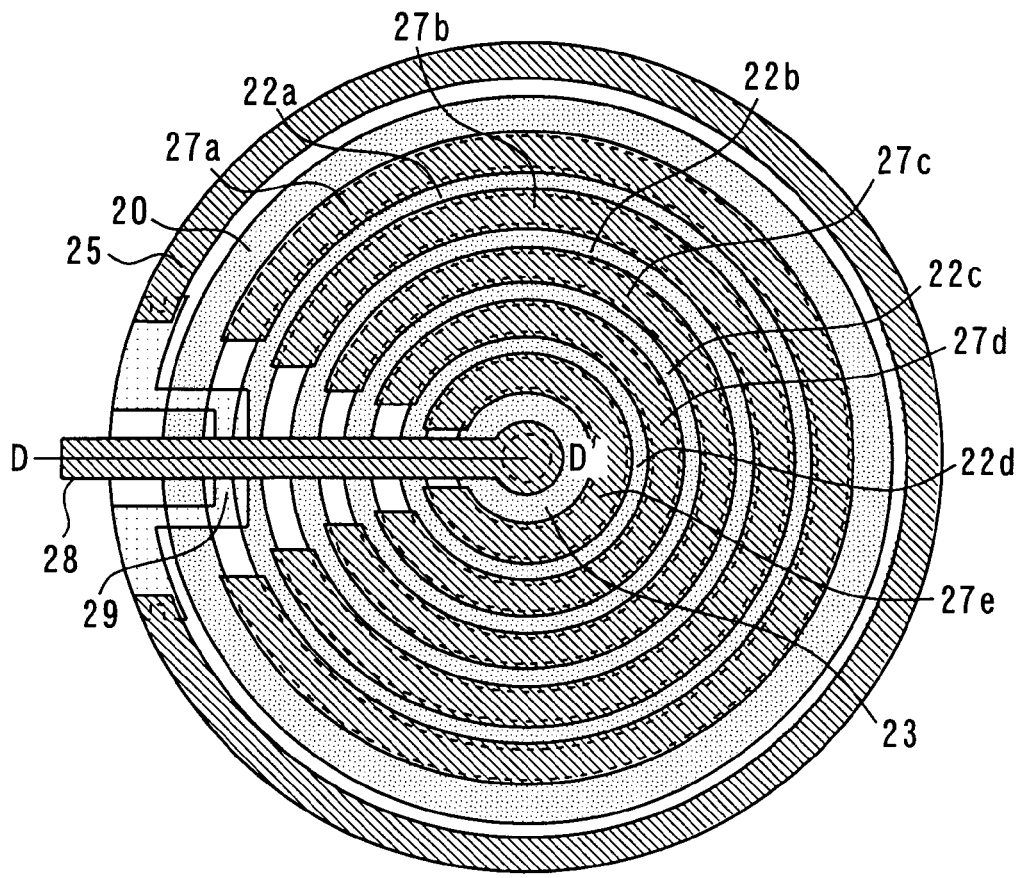
FIG. 7 is a plan view of a semiconductor device according to the third embodiment of the present invention.
Figure 8:
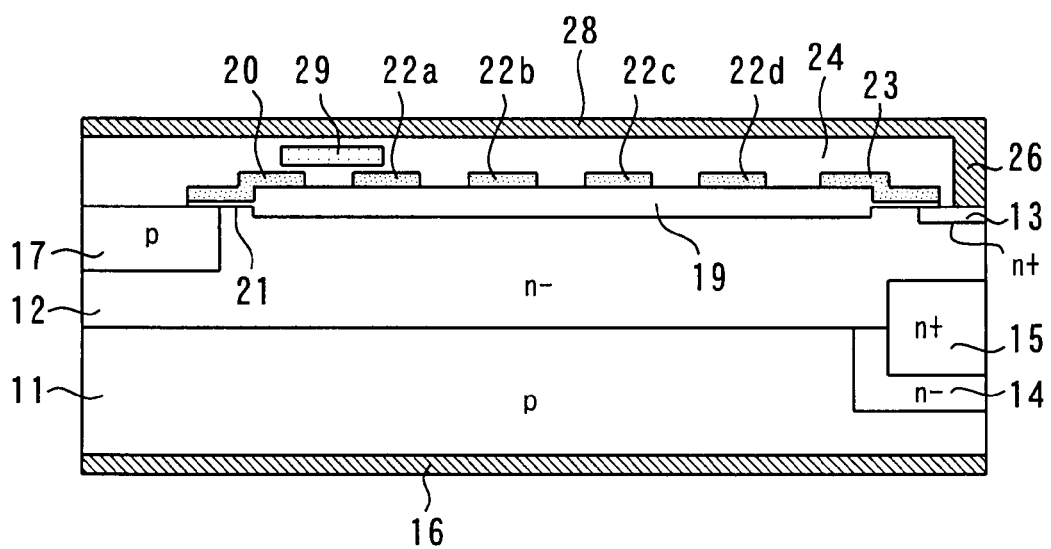
FIG. 8 is a sectional view taken along line D-D' in FIG. 7.

FIG. 7 is a plan view of a semiconductor device according to the third embodiment of the present invention. FIG. 8 is a sectional view taken along line D-D' in FIG. 7.

In the third embodiment, the shielding electrode 29 does not completely shield the first field plate 22a as in the first or second embodiment but overlaps only a portion of the first field plate 22a positioned closest to the source side. The potential on the shielding electrode 29 is set lower than the potential on the first field plate 22a. In other respects, the construction is the same as that of the first embodiment.

In this embodiment, the area of the overlap between the first field plate 22a and the shielding electrode 29 is adjusted to set the potential on the first field plate 22a to the desired value. That is, if the overlap area is increased, the potential on the first field plate 22a is shifted to a value on the lower-potential side. If the overlap area is reduced, the potential is shifted to a value on the higher-potential side. In this way, the desired withstand voltage can be maintained with stability.

Fourth Embodiment

Figure 9:
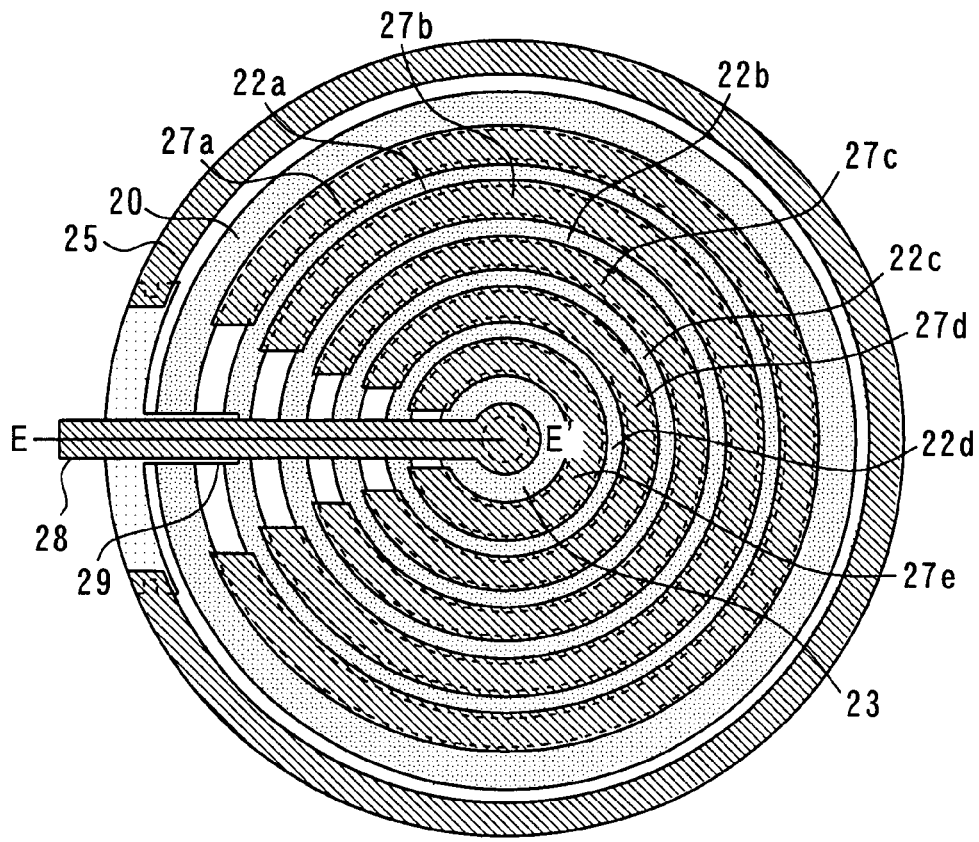
FIG. 9 is a plan view of a semiconductor device according to the fourth embodiment of the present invention.
Figure 10:
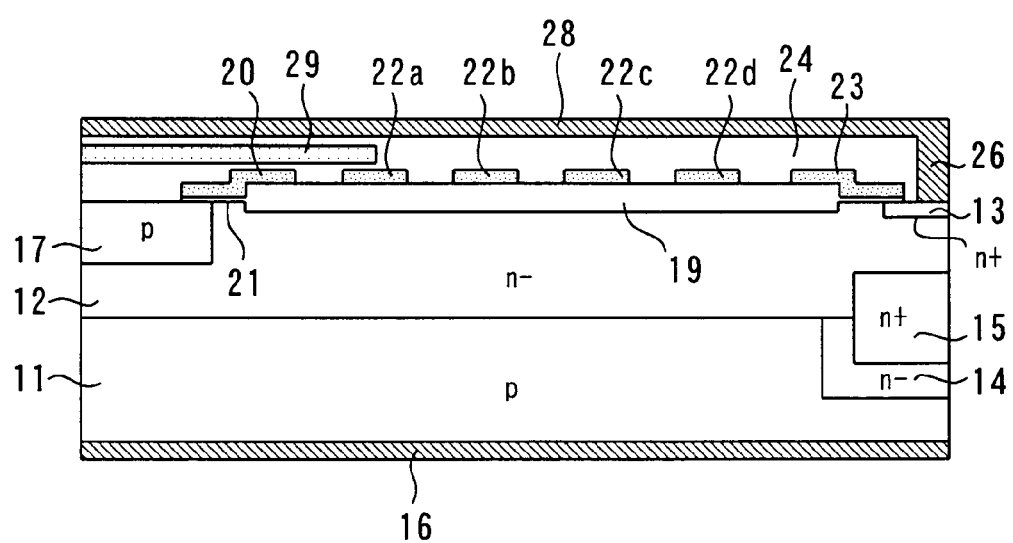
FIG. 10 is a sectional view taken along line E-E' in FIG. 9.
Figure 11:
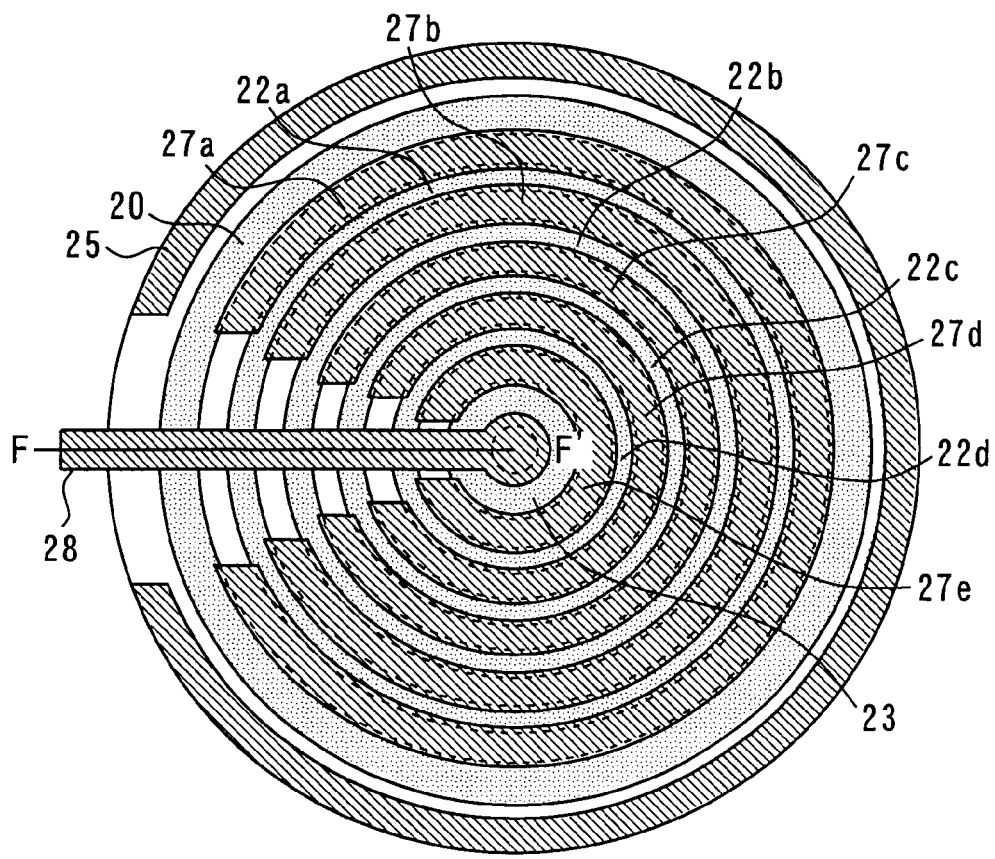
FIG. 11 is a plan view showing a conventional semiconductor device.
Figure 12:
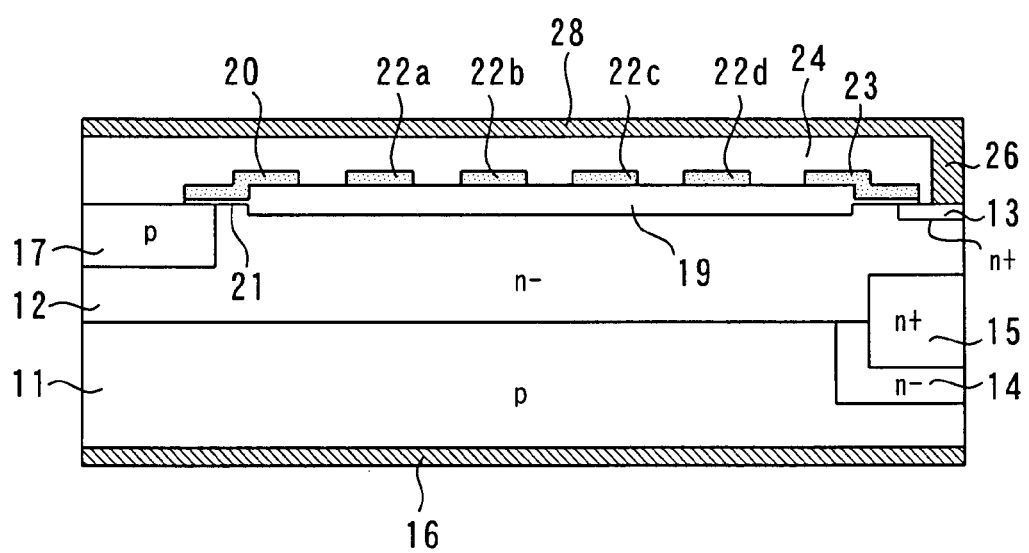
FIG. 12 is a sectional view taken along line F-F' in FIG. 11.

FIG. 9 is a plan view of a semiconductor device according to the fourth embodiment of the present invention. FIG. 10 is a sectional view taken along line E-E' in FIG. 9.

In the fourth embodiment, the shielding electrode 29 overlaps only a portion of the first shielding plate positioned closest to the source side, as does the shielding electrode 29 in the third embodiment. In other respects, the construction is the same as that of the second embodiment. The same effects as those of the second and third embodiments are achieved in this way.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-049445, filed on Feb. 28, 2007 including specification, claims, drawings and summary, on which the Convention priority of the present application is based, are incorporated herein by reference in its entirety.

What is claimed is:

1. A semiconductor device comprising:
   a semiconductor substrate of a first conduction type;
   a semiconductor layer of a second conduction type provided on the semiconductor substrate;
   a drain region of the second conduction type provided in an upper surface of the semiconductor layer and having an impurity concentration higher than that in the semiconductor layer;
   a drain electrode electrically connected to the drain region;
   an impurity region of the first conduction type provided in an upper surface of the semiconductor layer;
   a source region of the second conduction type provided in an upper surface of the impurity region;
   a first insulating film provided on the semiconductor layer between the impurity region and the drain region;
   a plurality of first field plates provided on the first insulating film along a direction from the source region toward the drain region while being spaced apart one from another;
   a gate electrode which covers an end portion of the impurity region interposed between the source region and the semiconductor layer, with a gate oxide film interposed between the gate electrode and the end portion of the impurity region;
   a second insulating film which covers the plurality of first field plates and the gate electrode;
   a plurality of second field plates provided directly on the second insulating film above gaps between the plurality of first field plates and contacting an upper surface of the second insulating film;
   a high-voltage wiring conductor provided directly on the second insulating film, contacting the upper surface of the second insulating film, and laterally separate from the plurality of second field plates, the high-voltage wiring conductor extending over the plurality of first field plates and electrically connected to the drain electrode; and
   a shielding electrode provided over the first field plate positioned closest to a source side and between the first field plate positioned closest to the source side and the high-voltage wiring conductor.

2. The semiconductor device according to claim 1, wherein a potential on the shielding electrode is lower than potentials on the plurality of first field plates.

3. The semiconductor device according to claim 2, wherein the shielding electrode is grounded.

4. The semiconductor device according to claim 2, wherein the shielding electrode is connected to the gate electrode.

5. The semiconductor device according to claim 1, wherein the shielding electrode is laid along the high-voltage wiring conductor on the lower-potential side of the plurality of first field plates.

6. The semiconductor device according to claim 1, wherein the shielding electrode overlaps only a portion of the first field plate positioned closest to the source side.

* * * * *